United States Patent [19]

Bichler

[11] Patent Number: 5,015,967
[45] Date of Patent: May 14, 1991

[54] INTEGRATABLE AMPLIFIER CIRCUIT

[75] Inventor: Helmut Bichler, Graefelfing, Fed. Rep. of Germany

[73] Assignee: Siemens Aktiengesellschaft, Munich, Fed. Rep. of Germany

[21] Appl. No.: 507,259

[22] Filed: Apr. 9, 1990

[30] Foreign Application Priority Data

Apr. 14, 1989 [EP] European Pat. Off. ............ 89106663

[51] Int. Cl.$^5$ ............................................. H03F 3/45
[52] U.S. Cl. ...................................... 330/257; 330/259
[58] Field of Search ..................... 330/257, 260, 259

[56] References Cited

U.S. PATENT DOCUMENTS

| | | | |
|---|---|---|---|
| 3,968,361 | 7/1976 | Bumgardner | 250/214 R |
| 4,042,886 | 8/1977 | Hanna | 330/23 |
| 4,092,611 | 5/1978 | Frederiksen et al. | 330/261 |
| 4,481,480 | 11/1984 | Metz | 330/294 |
| 4,689,580 | 8/1987 | Fukuda et al. | 330/257 X |

FOREIGN PATENT DOCUMENTS 2748647  5/1979  Fed. Rep. of Germany .

Primary Examiner—James B. Mullins
Attorney, Agent, or Firm—Herbert L. Lerner; Laurence A. Greenberg

[57] ABSTRACT

An integratable amplifier circuit includes a differential amplifier stage having a non-inverting input being acted upon by a first reference potential, an inverting input being acted upon by an input current, a non-inverting output, and an inverting output. A capacitor is connected between the non-inverting output and ground potential. A current source is connected between the inverting output and a supply potential. A first transistor of one conduction type has a collector connected to the supply potential, a base connected to the non-inverting output, and an emitter. A second transistor of the other conduction type has a collector connected to the inverting input, a base being acted upon by a second reference potential, and an emitter. A resistor is connected between the emitters of the first and second transistors.

8 Claims, 1 Drawing Sheet

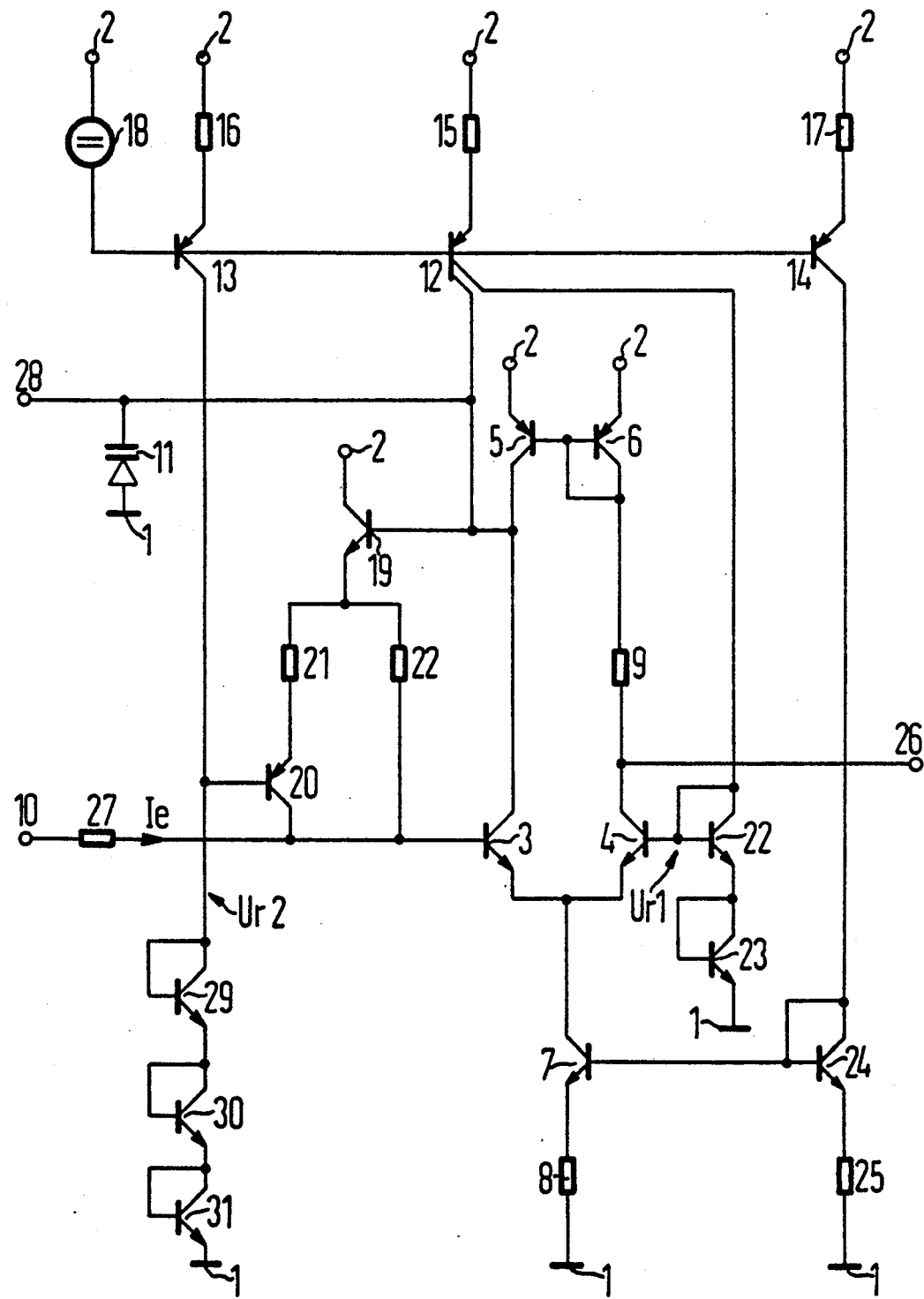

INTEGRATABLE AMPLIFIER CIRCUIT

The invention relates to an integratable amplifier circuit having a differential amplifier stage, the non-inverting input of which is acted upon by a first reference potential and the inverting input of which is acted upon by an input current.

In many applications, amplifier circuits are needed to raise a low level of an input signal. Interfering direct current components are often superimposed on the input signal. For instance, they can cause subsequent stages, and/or the amplifier circuit itself, to overmodulate, thus preventing proper further processing of the signal. Usually, an RC high-pass filter is therefore connected to the input side of the amplifier circuit. However, the disadvantage of such a connection is that the signal source is terminated by a frequency-dependent, predominantly unreal resistance. In many sensors, such as in photodiodes, a constant terminal resistance that is as real as possible is desirable, so that there will be the least possible influence.

It is accordingly an object of the invention to provide an integratable amplifier circuit, which overcomes the hereinafore-mentioned disadvantages of the heretofore-known devices of this general type, which suppresses the direct current components present in the signal and which has as constant an input resistance as possible.

With the foregoing and other objects in view there is provided, in accordance with the invention, an integratable amplifier circuit, comprising a differential amplifier stage having a non-inverting input being acted upon by a first reference potential, an inverting input being acted upon by an input current, a non-inverting output, and an inverting output, a capacitor connected between the non-inverting output and ground potential, a current source connected between the inverting output and a supply potential, a first transistor of one conduction type having a collector connected to the supply potential, a base connected to the non-inverting output, and an emitter, a second transistor of the other conduction type having a collector connected to the inverting input, a base being acted upon by a second reference potential, and an emitter, and a resistor connected between the emitters of the first and second transistors.

In accordance with another feature of the invention, there is provided a further resistor connected between the emitter of the first transistor and the inverting input of the differential amplifier stage.

In accordance with a further feature of the invention, the capacitor is a variable capacitance diode.

In accordance with an added feature of the invention, there are provided first means for generating the first reference potential, and second means for generating the second reference potential, each of the generating means including at least one series-connected diode being acted upon by a constant current.

In accordance with an additional feature of the invention, there is provided a further current source, a current mirror having input and output branches, and another resistor connected to the input branch of the current mirror, the differential amplifier stage including a pair of transistors being supplied by the further current source and having emitters being coupled together, one of the transistors of the pair of transistors having a collector forming the inverting output of the differential amplifier stage and being connected to the other resistor, and the other of the transistors of the pair of transistors having a collector being connected to the output branch of the current mirror.

In accordance with a concomitant feature of the invention, there is provided at least one other current source, and a current bank having output branches forming at least two of the current sources.

The advantages of the invention are high resistance to overmodulation and high primary amplification.

Other features which are considered as characteristic for the invention are set forth in the appended claims.

Although the invention is illustrated and described herein as embodied in an integratable amplifier circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with accompanying drawing.

The drawing is a schematic circuit diagram of an integrated amplifier circuit according to the invention.

Referring now to the single figure of the drawing in detail, there is seen an exemplary embodiment of a differential amplifier stage having a transistor pair being formed of two emitter-coupled npn transistors 3, 4. The two collectors of the transistors 3, 4 are each connected to one branch of a current mirror. The collector of the transistor 4 that forms the inverting output of the differential amplifier stage is connected through a resistor 9 to the input branch of the current mirror. The input branch of the current mirror has a pnp transistor 6 driven by joining the base and collector as a diode in the conducting direction and connecting it to a positive supply potential 2. The base of the transistor 6 is connected to the base of a pnp transistor 5 forming the output branch of the current mirror, the emitter thereof is likewise acted upon by the supply potential 2, and the collector thereof is connected to the collector of the transistor 3. The collector of the transistor 4 which forms the inverting output of the differential amplifier stage, is also connected to the output 26 of the amplifier circuit. The base of the transistor 4 is coupled to ground potential 1 through two series-connected npn transistors 22 and 23, each of which is operated as a diode in the conducting direction by joining the base and collector of each. The base of the transistor 4, which is provided as the non-inverting input of the differential amplifier stage, is also supplied by a first output of a current bank. The current bank of the present exemplary embodiment has a total of four outputs. The first output is formed by one collector of a pnp transistor 12, and the second output, which is connected to the collector of the transistor 3, is formed by the other collector of the transistor 12. A third output of the current bank, namely the collector of a pnp transistor 13, is carried to ground potential 1 through three series-connected npn transistors 29, 30, 31, each being operated as a diode in the conducting direction by joining the base and the collector thereof. The fourth output of the current bank, which is provided by the collector of a pnp transistor 14, is also connected to ground potential 1, through an npn transistor 24 and a resistor 25 connected in series with the transistor 24. The transistor 24 is operated as a diode in the conducting direction by joining the collector and the base thereof. The base of the transistor 24 is connected to the base of an npn transistor 7, the emitter of which is coupled through a resistor 8 to the ground potential 1 and the collector of which is connected to the coupled emitters of the transistors 3 and 4. In the current bank, the emitters of the transistors 12, 13, 14 are also connected to the supply potential 2 through respective resistors 15, 16, 17, and the bases of these transistors are connected together to a supply voltage source 18, the other terminal of which is connected to the supply potential 2.

The collector of an npn transistor 19 is acted upon by the supply potential 2 and the base thereof is connected to the collector of the transistor 3 as the non-inverting output of the differential amplifier stage. The emitter of the transistor 19 is connected to the base of the transistor 3, both through a resistor 22 and through a series circuit including a resistor 21 and the emitter-to-collector path of a pnp transistor 20. The base of the transistor 20 is connected to the third output of the current bank. The inverting input of the differential amplifier stage, namely the base of the transistor 3, is also connected through a resistor 27 to the input 10 of the amplifier circuit. Finally, a variable capacitance diode 11 is connected between the ground potential 1 and the non-inverting output of the differential amplifier stage. The non-inverting output is additionally connected to a connection terminal 28.

The functioning of the amplifier circuit shown is based on a frequency-dependent setting of the operating point of the differential amplifier stage. The operating point setting is accomplished first in a fixed manner, by imposition of a first reference potential Ur1 upon the non-inverting input of the differential amplifier stage, and second, in accordance with the invention, by providing an active negative feedback network between the non-inverting output and the inverting input. The active negative feedback network includes the transistors 19 and 20, the resistors 21 and 22, the variable capacitance diode 11 and a current source, which is provided by the second output of the current bank. The variable capacitance diode 11 and the current source provided by the second current output of the current bank form a low-pass filter, which is connected between the non-inverting output of the differential amplifier stage and the base of the transistor 19. With this low-pass-filtered output signal, the current flowing from the supply potential 2 to the inverting input is regulated by means of the transistor 19. This current can be split into two portions, namely one current portion passing through the resistor 22 and the other current portion passing through the resistor 21. The current through the resistor 21 is likewise regulatable by means of the transistor 20. Since the base of the transistor 20 is acted upon by a second reference potential Ur2, as the potential at the non-inverting output of the differential amplifier stage increases, the emitter potential of the transistor 19 and therefore the emitter potential of the transistor 20 increase as well. As a result, the transistor 20 becomes more strongly conductive, so that the current flowing through the resistor 20 is increased. Since the current flowing between the supply potential 2 and the inverting input of the differential amplifier stage is in phase opposition to an input current Ie flowing into the inverting input of the differential amplifier stage, the effective result is a subtraction of the two currents. In the final analysis, the low-pass behavior of the active negative feedback branch thus results in a high-pass behavior.

According to a feature of the invention, the two reference voltages Ur1, Ur2 are generated by means of a voltage drop at diode paths. To this end, in the present exemplary embodiment, two series-connected diodes supplied by a current source are provided for generating the first reference voltage Ur1, namely the suitably connected transistors 22 and 23, while three series-connected diodes supplied by a current source are provided for generating the second reference voltage, namely the suitably connected transistors 29, 30 and 31. The advantage in this case is that the diodes are very simple to manufacture as integrated elements, and they have an approximately identical temperature coefficient, so that after further processing by the differential amplifier stage, the overall temperature coefficient becomes approximately equal to zero. Constructing the current sources as a current bank also advantageously provides for good common mode operation.

According to another feature of the invention, the variable capacitance diode 11 is provided as a capacitor. This has the advantage of not requiring any external components. However, it is possible to add external elements for limit frequency setting, such as by externally connecting a capacitor parallel to the variable capacitance diode 11. In that case, however, the internal variable capacitance diode 11 can also be dispensed with.

The differential amplifier stage in the exemplary embodiment as shown in the drawing represents a preferred embodiment, but other embodiments are usable without restriction. The advantage of the embodiment shown is its very low expense for circuitry, because the current mirror having the transistors 5 and 6 and the resistor 9, along with adequate current limitation, provide a means for setting the operating point and for amplification.

In closing, it is noted that the invention can be constructed in either bipolar technology or MOS technology.

I claim:

1. Integratable amplifier circuit, comprising:
  a differential amplifier stage having a non-inverting input being acted upon by a first reference potential, an inverting input being acted upon by an input current, a non-inverting output, and an inverting output,
  a capacitor connected between the non-inverting output and ground potential,
  a current source connected between the inverting output and a supply potential,
  a first transistor of one conduction type having a collector connected to the supply potential, a base connected to the non-inverting output, and an emitter,
  a second transistor of the other conduction type having a collector connected to the inverting input, a base being acted upon by a second reference potential, and an emitter, and
  a resistor connected between the emitters of said first and second transistors.

2. Integratable amplifier circuit according to claim 1, including a further resistor connected between the emitter of said first transistor and the inverting input of said differential amplifier stage.

3. Integratable amplifier circuit according to claim wherein said capacitor is a variable capacitance diode.

4. Integratable amplifier circuit according to claim 1, including first means for generating the first reference potential, and second means for generating the second reference potential, each of said generating means including at least one series-connected diode being acted upon by a constant current.

5. Integratable amplifier circuit according to claim 1, including a current mirror having input and output branches, and another resistor connected to the input branch of said current mirror, said differential amplifier stage including a pair of transistors being supplied by said further current source and having emitters being coupled together, one of said transistors of said pair of transistors having a collector forming the inverting output of said differential amplifier stage and being connected to said other resistor, and the other of said transistors of said pair of transistors having a collector being connected to said output branch of said current mirror.

6. Integratable amplifier circuit according to claim 1, including at least one other current source, and a current bank having output branches forming at least two of said current sources.

7. Integratable amplifier circuit according to claim 6, wherein said current bank has output branches forming said current sources.

8. Integratable amplifier circuit, comprising:
- a differential amplifier stage having a non-inverting input, an inverting input, a non-inverting output, and an inverting output,
- a capacitor connected between the non-inverting output and a potential,
- a current source connected between the inverting output and another potential,
- a first transistor having a collector connected to the other potential, a base connected to the non-inverting output, and an emitter,
- a second transistor having a collector connected to the inverting input, a base, and an emitter, and
- a resistor connected between the emitters of said first and second transistors.

* * * * *